United States Patent [19]

Salesky et al.

[11] 4,085,340
[45] Apr. 18, 1978

[54] RANGE SWITCHING TRANSIENT ELIMINATOR CIRCUIT

[75] Inventors: Emery Salesky, Denville; Kent W. Luehman, Parsippany, both of N.J.

[73] Assignee: Hewlett-Packard Co., Palo Alto, Calif.

[21] Appl. No.: 676,848

[22] Filed: Apr. 14, 1976

[51] Int. Cl.² .................. H03K 5/08; H03G 3/30
[52] U.S. Cl. ............................. 307/237; 307/251; 307/264; 328/169; 330/141; 330/145
[58] Field of Search .............. 307/230, 237, 251, 264; 328/168, 169, 171, 142; 330/29, 141, 144

[56] References Cited

U.S. PATENT DOCUMENTS

| | | | |
|---|---|---|---|
| 3,206,689 | 9/1965 | Santana | 330/144 |
| 3,683,367 | 8/1972 | Monroe et al. | 330/29 |
| 3,719,895 | 3/1973 | Van der Puije | 330/29 |
| 3,748,495 | 7/1973 | Messinger | 307/237 |
| 3,770,984 | 11/1973 | Connor et al. | 330/141 |
| 3,898,580 | 8/1975 | Millsap | 330/29 |
| 3,904,975 | 9/1975 | Satoh | 307/237 |
| 3,976,894 | 8/1976 | Perkins, Jr. et al. | 307/251 |
| 3,988,694 | 10/1976 | Yamazaki | 330/29 |

Primary Examiner—Stanley D. Miller, Jr.

[57] ABSTRACT

A field effect transistor that shunts a gain control resistor of an operational amplifier is slowly rendered conductive by charging a capacitor through a gate to source resistor and rapidly rendered non-conductive by a transistor connected in parallel with said capacitor so as to prevent undesired transients in the output of the amplifier when the gain is changed from one discrete level to another.

3 Claims, 5 Drawing Figures

RANGE SWITCHING TRANSIENT ELIMINATOR CIRCUIT

BACKGROUND OF THE INVENTION

In programming the output of a direct current power supply a digital to analogue converter may convert the programmed digital information representing volts or amperes provided by the computer into a corresponding preliminary analogue voltage control signal. From the signal an analogue reference voltage control signal is derived which can be used as the reference voltage of the power supply. As the reference voltage changes, the output of the power supply changes in a corresponding manner.

Because it is derived from digital information, the output signal of the power supply can be accurate at a number of points determined by digital information. Therefore, if the output voltage of the supply should be limited to a range of 10 volts, the accuracy at any point will be greater than it would be if the range extended to 50 volts. If both ranges of operation are required, the program for the computer includes information as to the range, and the converter provides a range control signal. The signal is used to control a switch that changes the amplitude of the reference voltage control signal by simply changing the gain of amplifiers that provide it.

It has been found that a system as just described produces transient increases in the output voltage of the power supply when ranges are changed that can severly damage equipment connected to its output.

BRIEF DESCRIPTION OF THE INVENTION

In accordance with the invention certain of these transients are prevented by delaying the switching whenever the range control signal goes from a low range to a high range. At the same time the switching operation is rapid when going from a high range to a low range. As will be explained in greater detail, this switching action is required because of the slow response of the converter in producing the preliminary control signal and the slow response of the amplifier in producing the reference voltage control signal. These delays can cause the reference voltage control signal to be higher than the programmed value at a time when the gain provided by the amplifier is switched to a maximum value. This combination of events causes the output voltage of the power supply to exceed the required values.

DESCRIPTION OF PREFERRED EMBODIMENT

Figure 1:
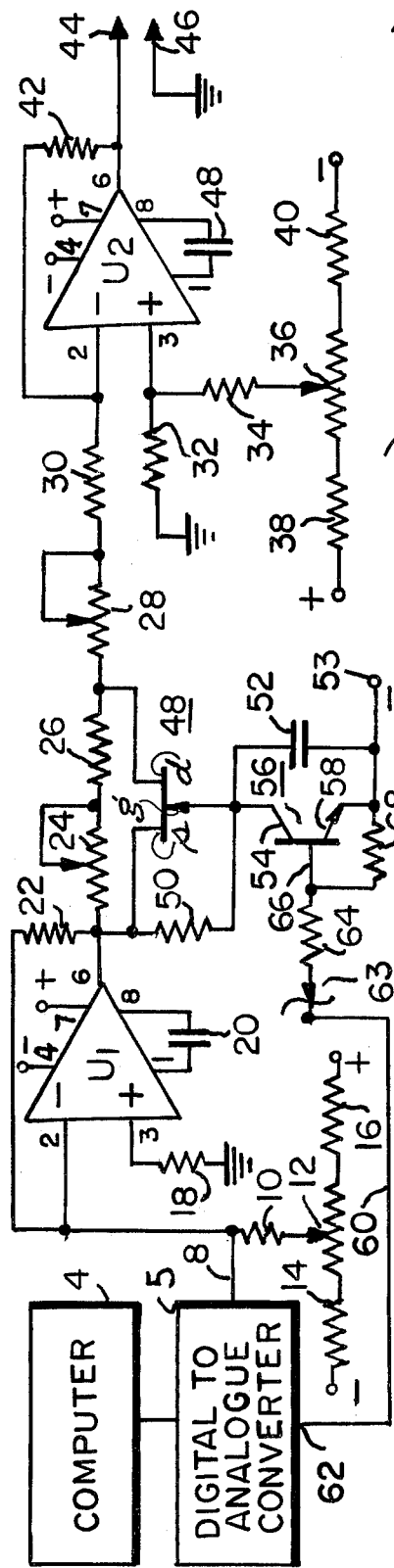
FIG. 1 shows a circuit embodying the principles of this invention.

In FIG. 1 a computer 4 provides the required digital information relating to changes in voltage and range to a digital to analogue converter 5 that supplies a current on a lead 8 that is connected to the negative input terminal 2 of a differential operational amplifier $U_1$ which may be an integrated circuit type 301A. Any offset voltage that may be required by the power supply is partially provided for by a resistor 10 connected between the terminal 2 of $U_1$ and the tap of a potentiometer 12 that is connected in series with the resistors 14 and 16 between sources of positive and negative voltage. The positive input terminal 3 of the amplifier $U_1$ is connected to ground by a resistor 18 to provide a virtual ground at terminal 2. A frequency compensating capacitor 20 is connected between the terminals 1 and 8 of $U_1$. Terminal 7 of $U_1$ is connected to a suitable source of positive bias voltage and the terminal 4 is connected to a suitable source of negative bias voltage. The gain of the amplifier $U_1$ is determined by a resistor 22 connected between the output terminal 6 and the input terminal 2. Although not so illustrated, all of the circuits shown could be contained in the converter 6.

The preliminary voltage control signal applied from the converter 5 on lead 8 to the terminal 2 of $U_1$ is in the form of a current. It is converted by $U_1$ to a voltage at the output terminal 6. A variable resistor 24, a fixed resistor 26, a variable resistor 28 and a fixed resistor 30 are connected in series in the order named between the output terminal 6 of $U_1$ and a negative input terminal 2 of an integrated circuit amplifier $U_2$ type 308. The positive terminal 3 of $U_2$ is biased to a potential required due to the offset requirements of the power supply by connecting it to the junction of a resistor 32 having its remote end at ground and a resistor 34 having its remote end connected to a tap on a potentiometer 36 that is connected in series with resistors 38 and 40 on either side to respectively positive and negative sources of potential not shown. A resistor 42 is connected between the input terminal 2 of $U_2$ and its output terminal 6. The reference control voltage is available between the output terminal 44 connected to the terminal 6 and a grounded terminal 46. Suitable positive and negative bias potentials are applied to the terminal 7 and 4 of $U_2$, and a frequency compensating capacitor 48 is connected between the terminals 1 and 8.

As is well understood by those skilled in the art, the gain of the amplifier $U_2$ is determined by the ratio of the resistance of the resistor 42 to the sum of the resistance effectively connected in series between its input terminal 2 and the output terminal 6 of $U_1$. Therefore, the greater the value of the input resistance, the smaller the gain of $U_2$. In order to change the latter resistance and thus vary the operation from the low range to high range, a switch is connected in parallel with the resistors 24 and 26. When the switch is open, the gain of the amplifier $U_2$ is low, and when it is closed so as to short out the resistors 24 and 26, the gain of $U_2$ is increased.

In accordance with this invention the switch is a field effect transistor 48 having its source electrode $s$ connected to the output terminal 6 of $U_1$ and its drain electrode $d$ connected to the junction of the resistors 26, 28. Thus, the source to drain path is in shunt with the resistors 24, 26. Further in accordance with this invention, the source electrode $s$ is connected via a resistor 50 and a capacitor 52 in the order named to a point 53 of negative potential that can be connected to a suitable source, not shown, in the converter 5. The gate $g$ of the transistor 48 is connected to the junction between the resistor 50 and the capacitor 52. The collector 54 of an NPN transistor 56 is connected to the gate $g$, and its emitter 58 is connected to the point 53 of negative potential with the result that the collector-emitter path of the transistor 56 is in shunt with the capacitor 52. A lead 60 is connected between an output 62 of the converter 5 at which range control signals are provided to a voltage dropping zener diode 63, and a resistor 64 is connected between the diode 63 and the base 66 of the transistor 56. A resistor 68 is connected between the base 66 and the emitter 58.

The operation of the circuit is as follows. In low range operation the converter 5 supplies a sufficiently positive voltage on the lead 60 to cause the transistor 56 to conduct. The current that flows through the resistor 50 biases the gate $g$ of the field effect transistor 48 negative with respect to the source $s$. Current flow through the transistor 48 is turned off and the gain of the amplifier $U_2$ is a low value proportional to the resistance of the resistor 42 divided by the sum of the resistances of all the resistors 24, 26, 28 and 30.

In high range operation, the converter 5 supplies a relatively negative voltage on the lead 60 that cuts off the transistor 56. The capacitor 52 gradually charges and when fully charged, the gate to source voltage equals zero and the transistor 48 is turned fully on with the result that the resistors 24 and 26 are effectively short circuited. The gain of the amplifier $U_2$ is then proportional to the resistance of the resistor 42 divided by the resistance of the resistors 28 and 30, and, therefore much greater than before.

That the circuit of FIG. 1 will prevent transient rises in voltage that exceed the programmed value can be understood from consideration of the various graphs.

Figure 2A:
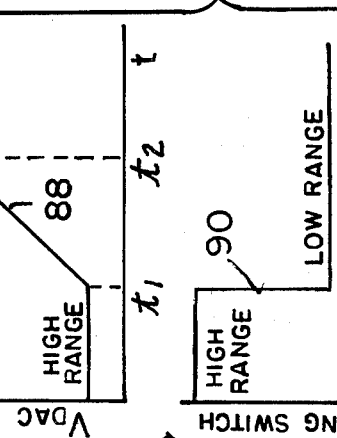
FIGS. 2A, 2B, 2C and 2D are graphs useful in explaining the operation of the circuit of FIG. 1.

FIG. 2A represents a situation where the preliminary control voltage signal is programmed to decrease at time $t_1$ and the range or gain control signal is programmed to change from a value for low range $r_l$ to a value of high range $r_h$. Due to delay in the digital to analogue converter 5 and also in $U_2$, the preliminary control voltage at terminal 6 of $U_1$ does not reach its final value until time $t_2$, as illustrated by the curve 70. However, the usual range switch operates nearly instantaneously, as shown by the curve 72. Because the preliminary control voltage does not also go immediately to its programmed value, the reference control voltage produced at the output terminals 44, 46 will have a transient, as indicated by the curve 74, that is in excess of the programmed value.

Figure 2B:
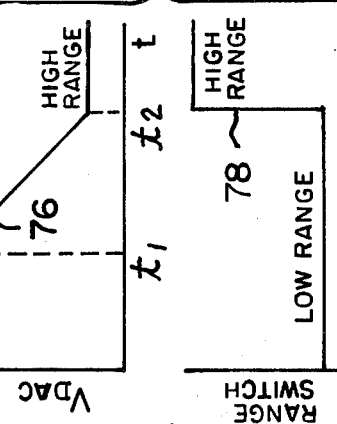

It will be noted, however, that with the range switch of FIG. 1, the field effect transistor 48 does not become a short circuit and set up a condition of maximum gain until the capacitor 52 becomes fully charged. This produces an operation such as illustrated by the curves 76, 78 and 80 of FIG. 2B that correspond to the curves 70, 72 and 74. Note that instead of a transient that exceeds the programmed amplitude, the transient of curve 80 is less than this value so that a load connected to the output terminals 44, 46 of FIG. 1 will not be damaged.

Figure 2C:
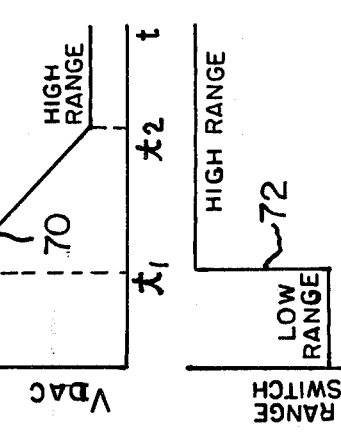
Figure 2D:
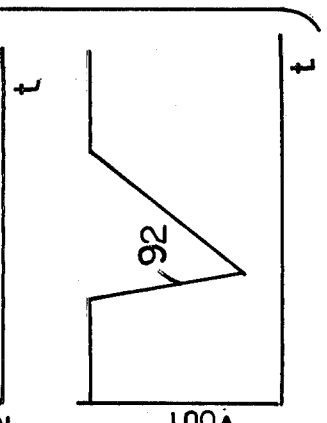

On the other hand, suppose the programmed preliminary control voltage starts to increase at time $t_1$ and that due to the delay of $U_1$ it does not reach its final value until time $t_2$, as indicated by the curve 82 of FIG. 2C. If the range switch action is delayed until time $t_2$, as indicated by the curve 84 of FIG. 2C, a positive transient indicated by the curve 86 results. In the circuit of FIG. 1, the transition from high to low range takes place quickly because of the conduction of the transistor 56 which effectively shorts capacitor 52 and, therefore, the operation is as illustrated by the curves 88, 90 and 92 of FIG. 2D wherein the transient of the curve 92 is less than the programmed value.

It will be apparent to those skilled in the art that the circuit can be fabricated with transistor types that are complementary to those shown. For example, the transistor 48 could be a P channel type, in which event the transistor 56 would be a PNP type and the voltage at point 53 would be positive.

In as much as the reference voltage to be provided at the output terminals 44, 46 may be either positive or negative, it is necessary that the transistor 48 be capable of conducting in either direction and it is preferable that it not have a fixed voltage across it.

What is claimed is:

1. An operational amplifier having positive and negative inputs and an output, a resistor connected between said output and said negative input, bias supply means coupled to said positive input, a plurality of resistors connected in series to said negative input, a switch connected in shunt with at least one of said series resistors, said switch being a field effect transistor having source, drain and gate electrodes, means connecting said source-drain path in parallel with at least one said series resistor, a bias resistor connected between one of the source and drain electrodes and said gate electrode, a source of direct current potential, a capacitor connected between said gate electrode and said source of potential, and a transistor, means connecting its collector-emitter path in parallel with said capacitor.

2. Apparatus comprising
an input terminal to which a voltage to be amplified may be applied,
an operational amplifier having an inverting input, a non-inverting input and an output,
resistance means connected between said input terminal and said inverting input of said operational amplifier,
a resistor connected between said output of said operational amplifier and said inverting input,
means for supplying a biasing potential to said non-inverting input of said operational amplifier,
a field effect transistor having source, drain and gate electrodes,
connections between said source and drain electrodes to different points on said resistive means so that the source-drain path of said field effect transistor is in shunt with the portion of the resistive means that lies between said points,
a bias resistor connected between said input terminal to which a voltage to be amplified may be applied and said gate electrode of said field effect transistor,
a capacitor connected between said gate electrode and a point of reference potential,
a transistor having a collector, emitter and base electrodes,
a connection between said collector electrode of said transistor and one side of said capacitor,
a connection between said emitter electrode of said transistor and the other side of said capacitor,
whereby a range signal voltage applied to said base electrode of such polarity as to cut off said transistor causes the bias voltage applied to said gate electrode of said field effect transistor to change slowly toward a conduction level as determined by the charging of said capacitor through said bias resistor, and whereby a range signal voltage applied to said base electrode of such polarity as to cause said transistor to conduct, causes the bias voltage applied to said gate electrode to change quickly to a level at which said field effect transistor is cut off.

3. Apparatus for producing a direct current reference voltage in response to a voltage control signal that changes slowly between values that are inversely proportional to the amplification to be effected in response to a gain control signal that changes quickly between a value for low gain and a value for high gain comprising,
- a direct current amplifier having an input to which said voltage control signals can be connected and an output from which the direct current reference voltage may be derived,
- gain control means coupled to said amplifier,
- means coupled to said gain control means for causing it to delay the increases in gain of said amplifier in response to change in said gain control signal from a value for low gain to a value for high gain, and
- means coupled to said gain control means for causing it to quickly decrease the gain of said amplifier in response to changes in said gain control signal from a value for high gain to a value of low gain,
- thereby preventing the amplifier from having high gain when the voltage control signals have a high value.

* * * * *